United States Patent [19]
Clampitt et al.

[11] Patent Number: 5,939,741
[45] Date of Patent: Aug. 17, 1999

[54] METHODS OF FORMING INTEGRATED CIRCUITRY AND INTEGRATED CIRCUITRY STRUCTURES

[75] Inventors: Darwin A. Clampitt, Boise; James E. Green, Caldwell, both of Id.

[73] Assignee: Micron Technology, Inc., Boise, Id.

[21] Appl. No.: 09/095,004

[22] Filed: Jun. 9, 1998

Related U.S. Application Data

[62] Division of application No. 09/018,208, Jan. 29, 1998.

[51] Int. Cl.[6] .......................... H01L 29/80; H01L 31/112
[52] U.S. Cl. .......................... 257/278; 257/287; 438/719; 438/735; 438/753; 216/2
[58] Field of Search .................... 216/2; 438/719, 438/733, 735, 753; 257/278, 287

[56] References Cited

U.S. PATENT DOCUMENTS

| | | |
|---|---|---|
| 3,579,057 | 5/1971 | Stoller ........................ 438/753 |
| 5,013,680 | 5/1991 | Lowrey et al. ............... 437/52 |
| 5,628,917 | 5/1997 | MacDonald .................. 216/2 |
| 5,660,680 | 8/1997 | Keller .......................... 216/2 X |

*Primary Examiner*—William Powell
*Attorney, Agent, or Firm*—Wells, St. John, Roberts, Gregory & Matkin P.S.

[57] ABSTRACT

In one aspect, a plurality of layers are formed over a substrate and a series of first trenches are etched into a first of the layers in a first direction. A series of second trenches are etched into the first layer in a second direction which is different from the first direction. Collectively, the first and second trenches define a plurality of different substrate elevations with adjacent elevations being joined by sidewalls which extend therebetween. Sidewall spacers are formed over the sidewalls, and material of the first layer is substantially selectively etched relative to material from which the spacers are formed. Material comprising the spacer material is substantially selectively etched relative to the first material. In a preferred implementation, the etching provides a plurality of cells which are separated from one another by no more than a lateral width dimension of a previously-formed spacer.

6 Claims, 19 Drawing Sheets

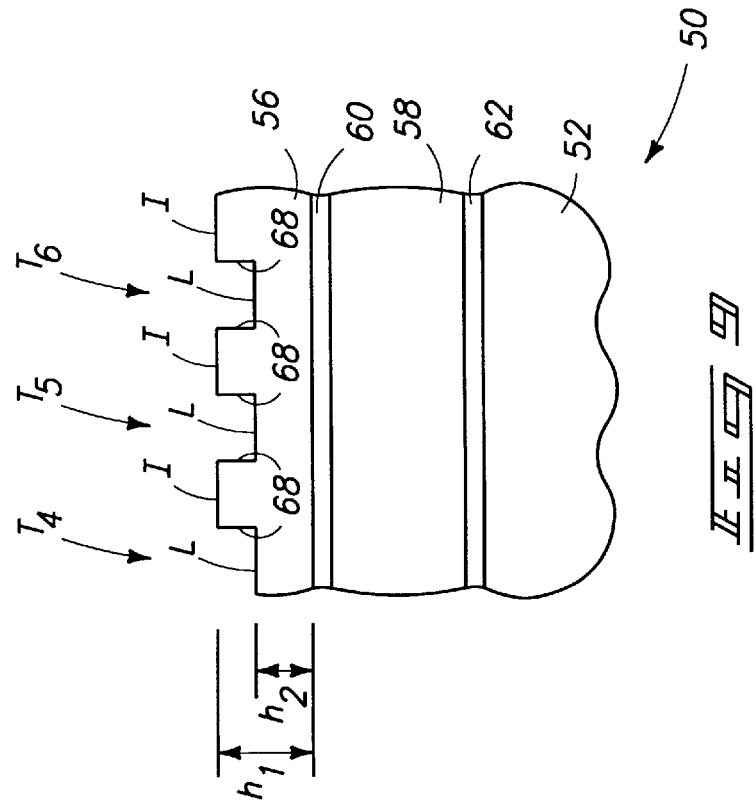
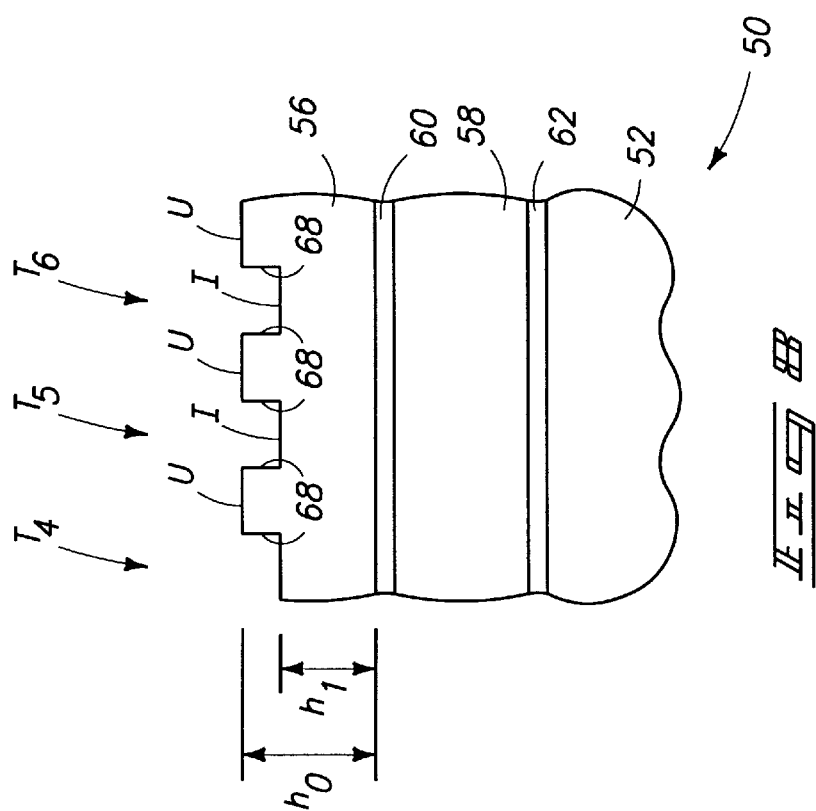

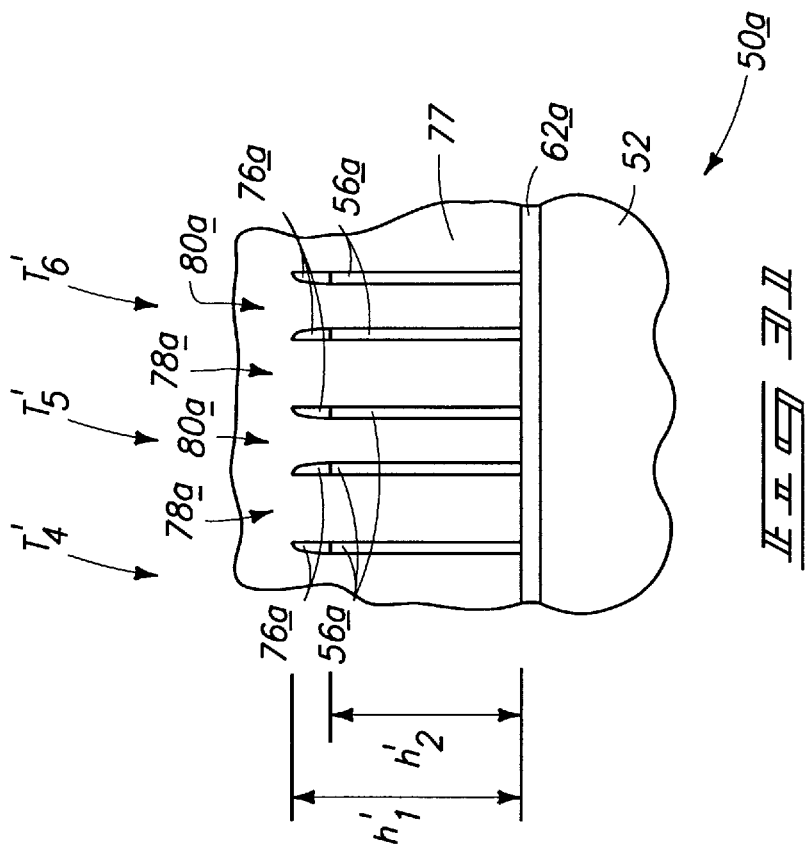
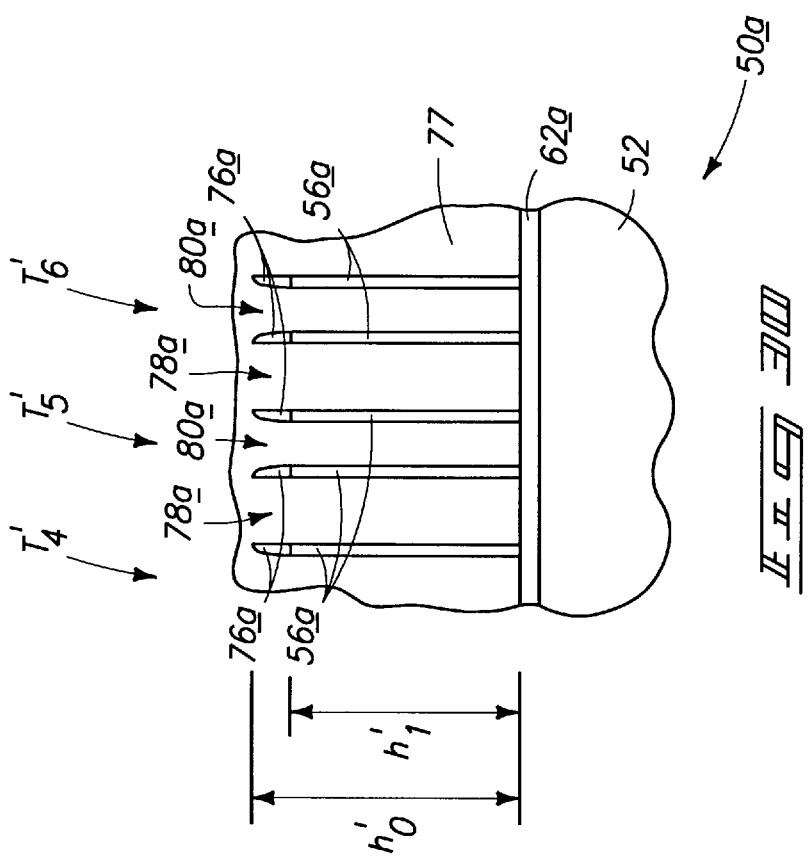

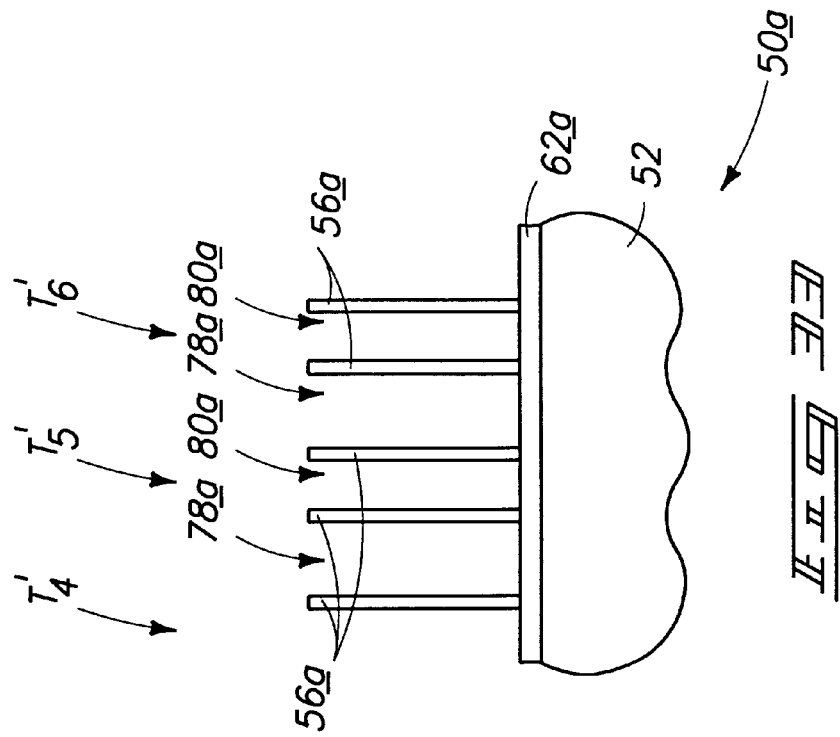
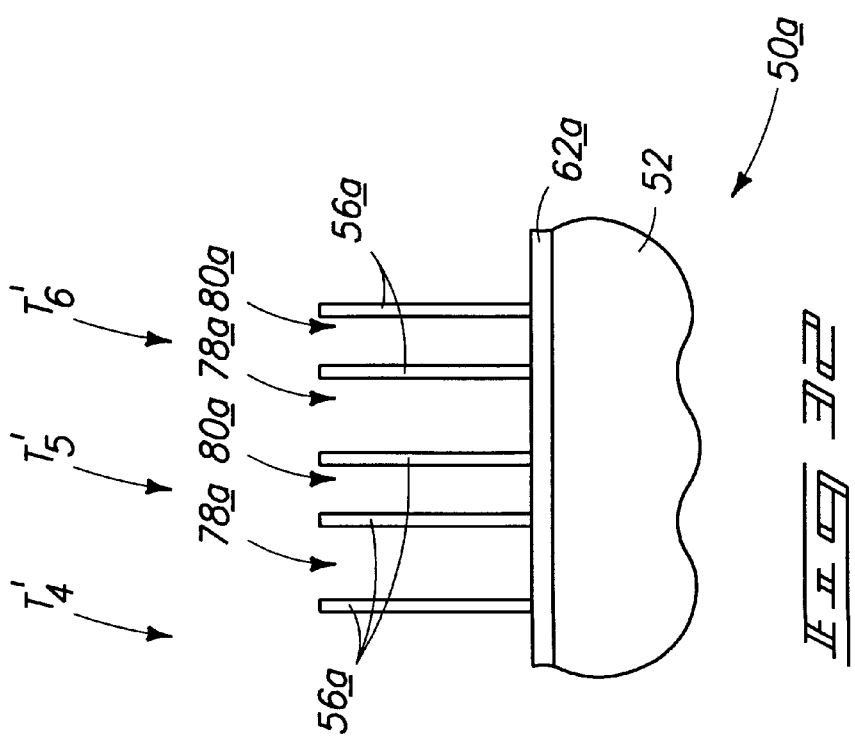

METHODS OF FORMING INTEGRATED CIRCUITRY AND INTEGRATED CIRCUITRY STRUCTURES

RELATED PATENT DATA

This patent resulted from a divisional application of U.S. patent application Ser. No. 09/018,208, filed Jan. 29, 1998, entitled "Methods of Forming Integrated Circuitry and Integrated Circuitry Structures", naming Darwin A. Clampitt and James E. Green as inventors, the disclosure of which is incorporated by reference.

TECHNICAL FIELD

This invention pertains to methods of forming integrated circuitry and to resultant integrated circuitry structures.

BACKGROUND OF THE INVENTION

Integrated circuitry devices which are fabricated on or over semiconductor wafers typically undergo one or more photolithographic steps during formation. During such photolithographic steps, device features can be etched using conventional techniques. The spacing between such devices is important because often times adjacent devices must be electrically isolated from one another to avoid undesirable shorting conditions.

One of the limitations on device spacing stems from limitations inherent in the photolithographic process itself. In the prior art, devices are generally spaced only as close as the minimum photolithographic limit will permit.

This invention arose out of concerns associated with integrated circuitry structures having spacing aspects which are not necessarily limited by minimum photolithographic feature sizes.

SUMMARY OF THE INVENTION

In one aspect, a plurality of layers are formed over a substrate and a series of first trenches are etched into a first of the layers in a first direction. A series of second trenches fire etched into the first layer in a second direction which is different from the first direction. Collectively, the first and second trenches define a plurality of different substrate elevations, with adjacent elevations being joined by sidewalls which extend there between. Sidewall spacers are formed over the sidewalls, and material of the first layer is substantially selectively etched relative to material from which the spacers are formed. Material comprising the spacer material is substantially selectively etched relative to the first material. In a preferred implementation, the etching provides a plurality of cells which are separated from one another by no more than a lateral width dimension of a previously-formed spacer.

BRIEF DESCRIPTION OF THE DRAWINGS

Preferred embodiments of the invention are described below with reference to the following accompanying drawings.

FIGS. 8 and 9 are views of the FIG. 5 wafer fragment taken respectively along lines 8—8 and 9—9 in FIG. 5.

FIGS. 12 and 13 are respective views of the FIGS. 8 and 9 wafer fragment at another processing step.

FIGS. 30 and 31 are respective views of the FIGS. 24 and 25 wafer fragment at another processing step.

FIGS. 32 and 33 are respective views of the FIGS. 24 and 25 wafer fragment at another processing step.

FIG. 34 is an enlarged perspective view of the FIGS. 12 and 13 wafer fragment showing a plurality of different elevational levels. A is portion of the figure has been broken away for clarity.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
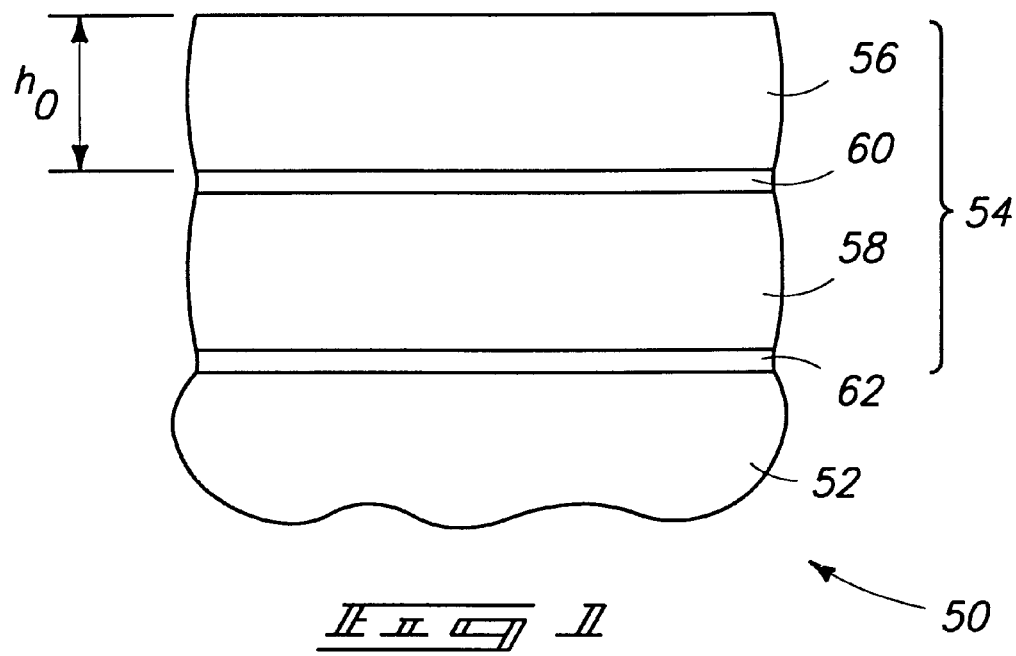
FIG. 1 is a diagrammatic sectional view of a semiconductor wafer fragment in process in accordance with one aspect of the invention.

Referring to FIG. 1, a semiconductor wafer fragment in process is indicated generally by reference numeral 50 and comprise a semiconductive substrate 52. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A plurality of layers are formed over substrate 52 and define an assembly of layers 54. In the illustrated example assembly 54 comprises a first layer 56 and a second layer 58 interposed between first layer 56 and substrate 52. An optional third layer 60 can be provided and is interposed between first layer 56 and second layer 58. Third layer 60 serves as an etch stop layer as will become apparent below. An optional fourth layer 62 can be provided elevationally below second layer 58.

Layer 56 defines an elevational height $h_0$ which is taken relative to layer 60. A desirable aspect of the layers comprising assembly 54 are that the individual layers exhibit a very good etch selectivity, e.g. about 50:1 or more, relative to an underlying layer disposed immediately therebeneath. Accordingly and in the illustralted example, first and second layers 56, 58 preferably comprise etchably similar materials while intervening layer 60 comprises a material which is etchably different from either of layers 56, 58. An exemplary material for layers 56, 58 comprises an oxide material such as borophosphosilicate glass. An exemplary material for layer 60 comprises polysilicon. An exemplary material for layer 62 comprises silicon nitride. Of course, either material could be used for layers 60 and 62 depending on the structure being made.

Figure 2:
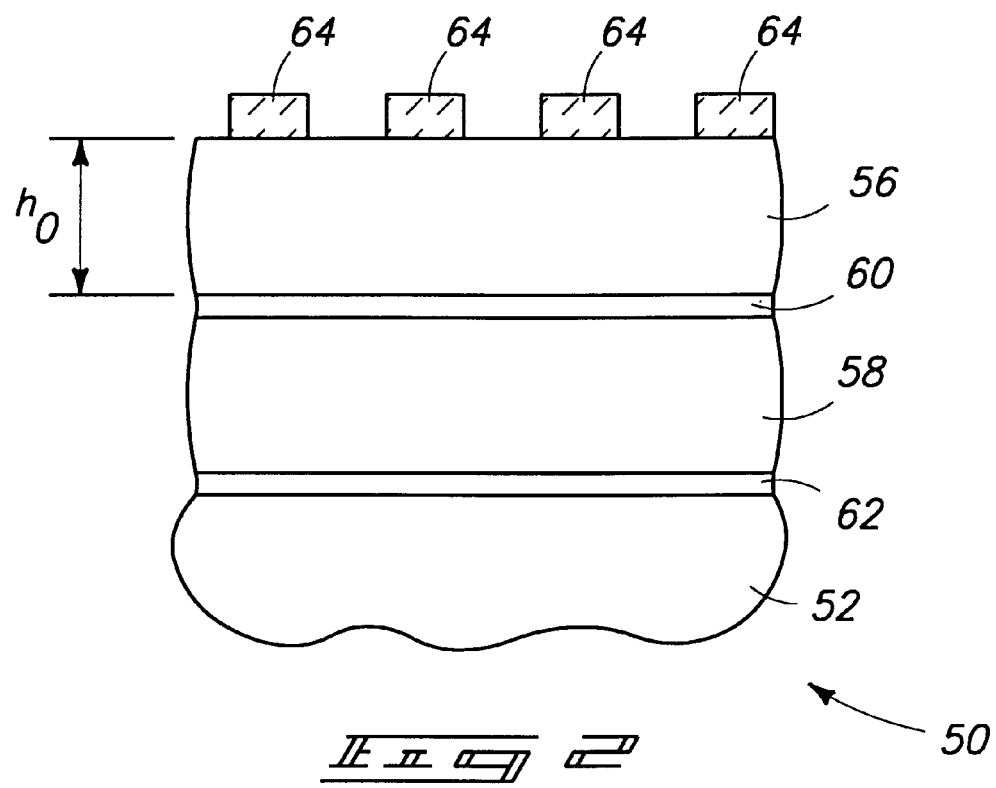
FIG. 2 is a view of the FIG. 1 wafer fragment at a different processing step.

Referring to FIG. 2, a layer of patterned photoresist 64 is formed over substrate 52 and atop layer 56.

Figure 3:
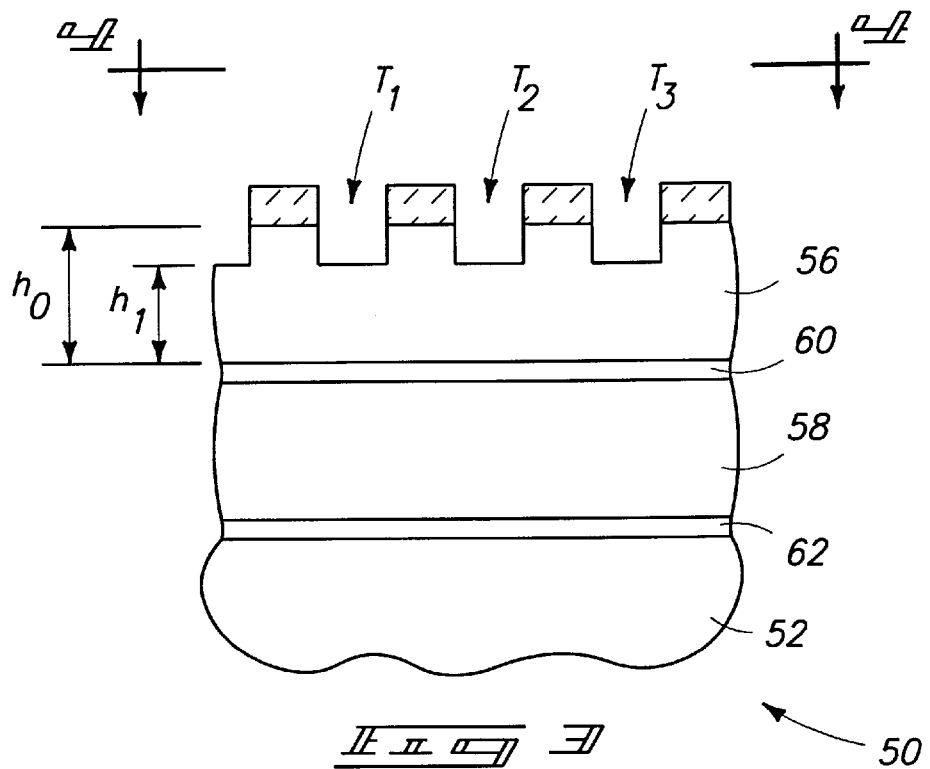
FIG. 3 is a view of the FIG. 1 wafer fragment at a different processing step.
Figure 4:
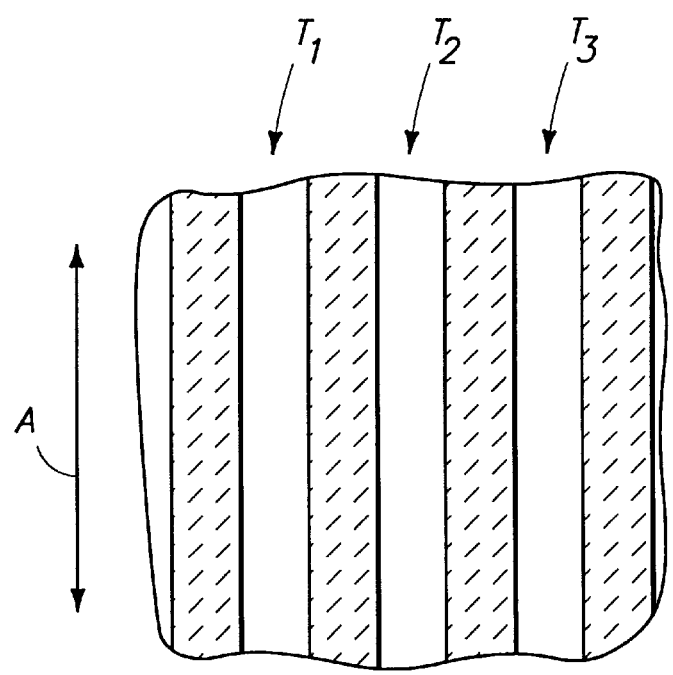
FIG. 4 is a view taken along line 4—4 in FIG. 3.
Figure 5:
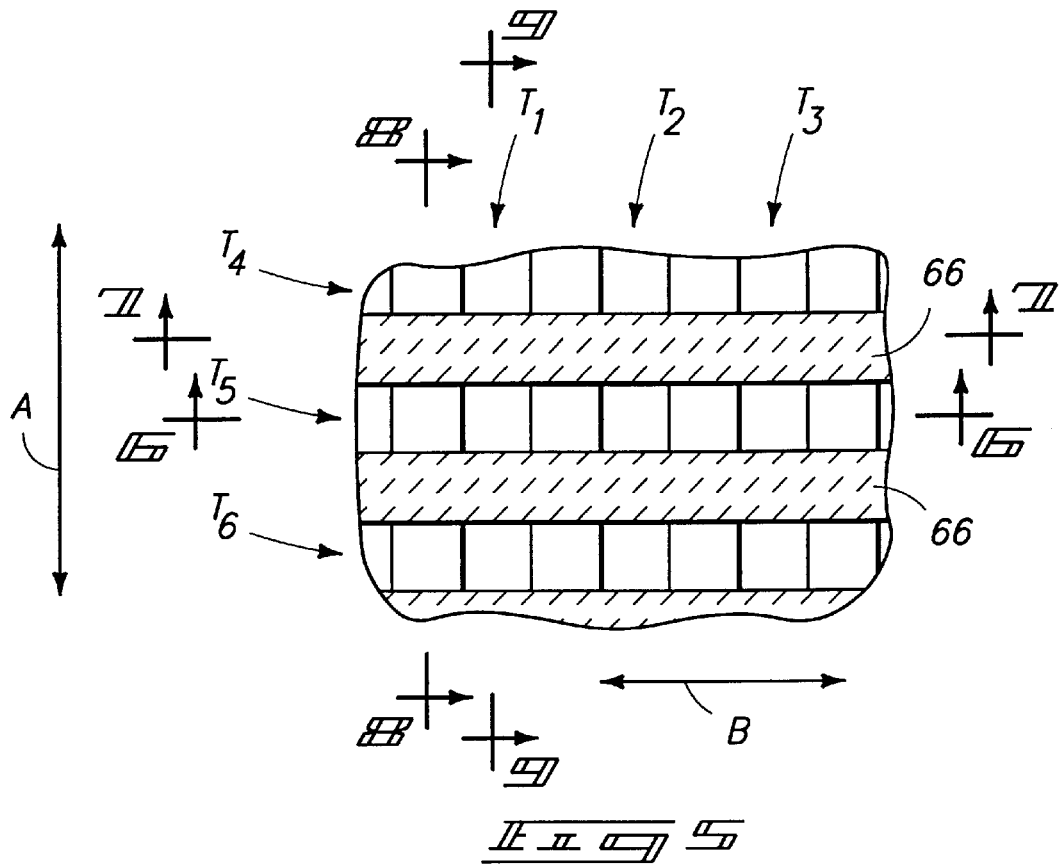
FIG. 5 is a view of the FIG. 4 wafer fragment at another
Figure 6:
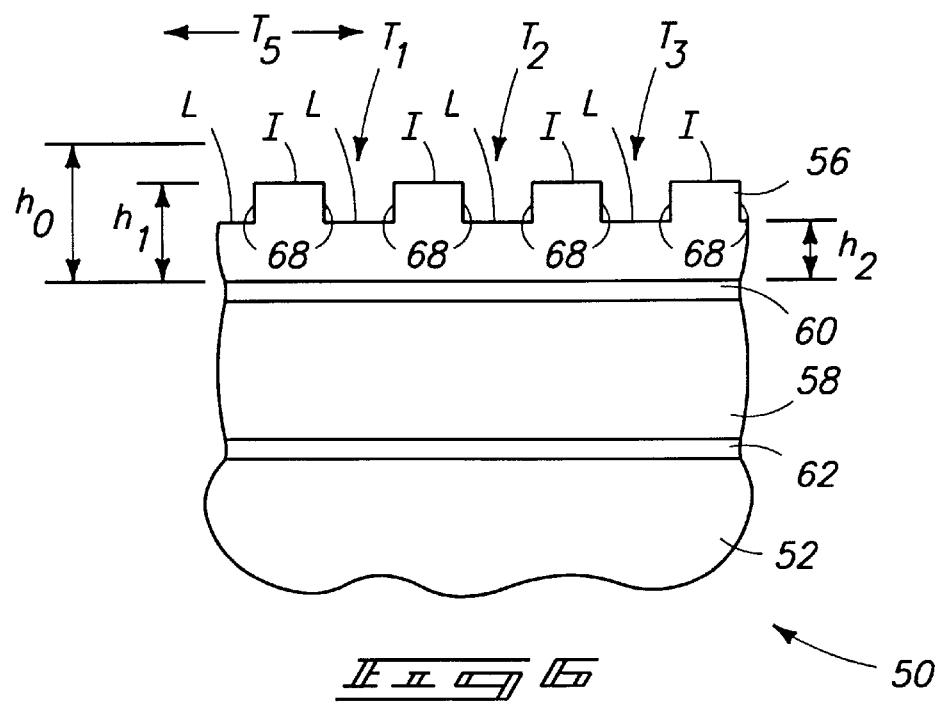
FIG. 6 is a view of the FIG. 5 wafer fragment taken along line 6—6 in FIG. 5.
Figure 7:
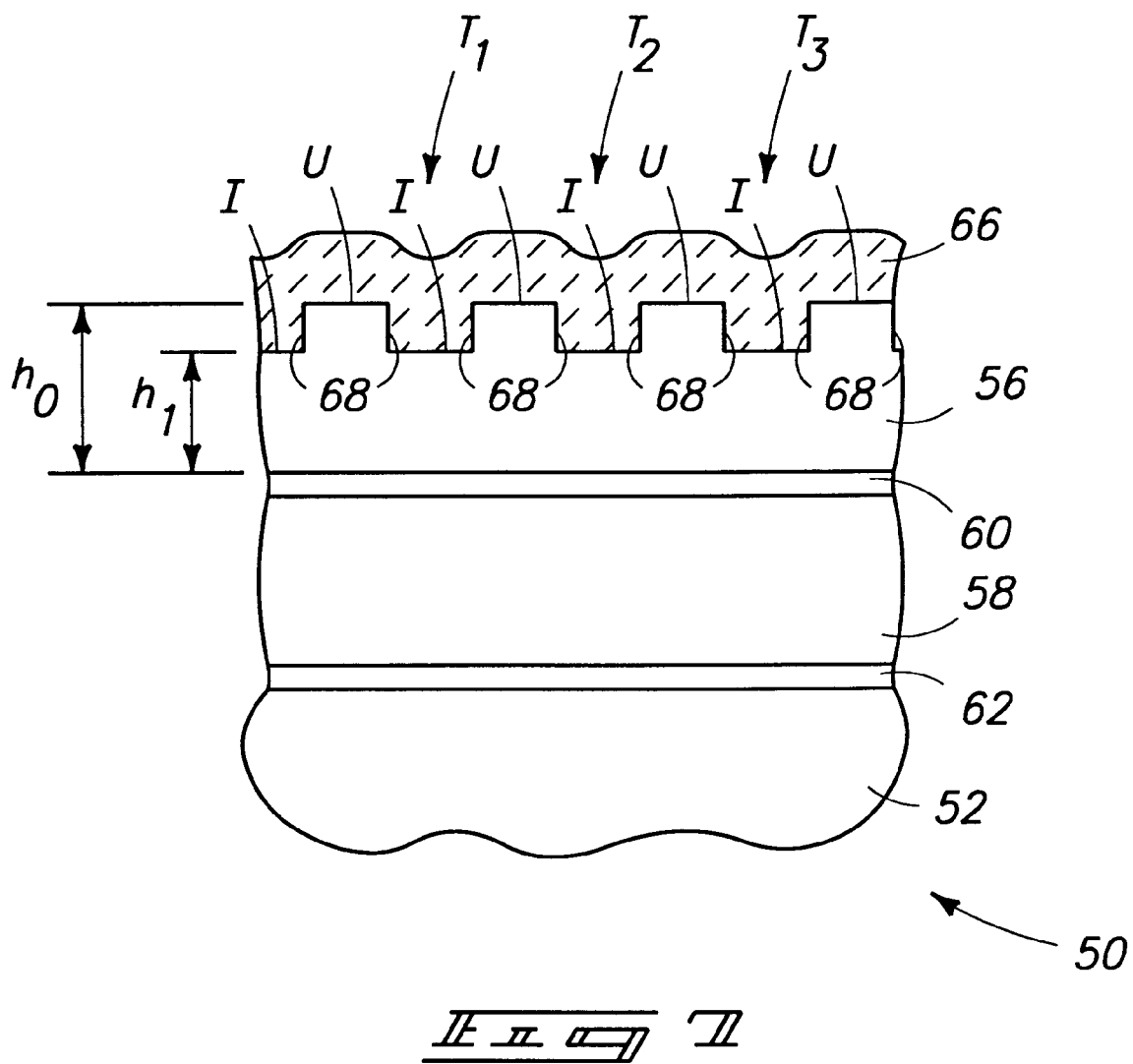
FIG. 7 is a view of the FIG. 5 wafer fragment taken along line 7—7 in FIG. 5.
Figure 10:
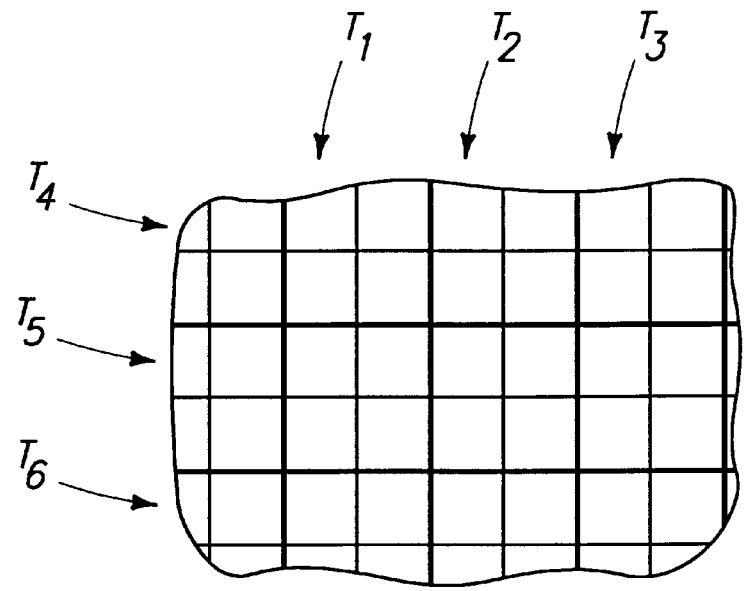
FIG. 10 is a view of the FIG. 5 wafer fragment at another processing step.

Referring to FIGS. 3 and 4, a first series of first trenches $T_1$, $T_2$, $T_3$ are etched or otherwise formed into first layer 56 and in a first direction A (FIG. 4). Trenches $T_1$, $T_2$, $T_3$ include bottommost portions which define an elevational height $h_1$ which is less than $h_0$. An exemplary depth for the trench-forming etch is between about 1,000 to 2,000 Angstroms. Photoresist 64 is subsequently removed.

Referring to FIGS. 5–9, a layer of patterned photoresist 66 (FIG. 5) is formed over substrate 52 and defines a second series of second trenches $T_4$, $T_5$, $T_6$ which are subsequently etched into first layer 56 in a second direction B. In the illustrated example, second direction B in is different from first direction A, and generally transverse relative thereto. Some of the substrate area which is exposed between photoresist 66 is etched to define an elevational height $h_2$ (FIGS. 6 and 9) which is less than either of heights $h_1$ and $h_0$. Those portions of the substrate which define elevational heights $h_2$ have been correspondingly etched twice. Those portions of the substrate which define elevational heights $h_1$ have been correspondingly etched only once. Similarly, those portions of the substrate which define elevational heights $h_0$ have not been etched at all. An exemplary depth for the second trench-forming etch is between about 1,000 to 2,000 Angstroms.

Referring to FIGS. 6–11, and 34, the net effect of the above-described first and second etchings is that an array of trenches, e.g. $T_1$, $T_2$, $T_3$, $T_4$, $T_5$, and $T_6$, are formed in first layer 56. The trench array defines a plurality of different substrate elevations or elevational heights. In the illustrated example, first, second, and third elevations are defined. Exemplary first, second, and third elevations are respectively indicated at 70, 72, and 74 and have been separately designated with letters to assist the reader. First elevation 70 defines a lowermost elevation L (which corresponds to elevational height $h_2$). Second elevation 72 defines an intermediate elevation I (which corresponds to elevational height $h_1$). Third elevation 74 defines an uppermost elevation U (which corresponds to elevational height $h_0$). First, second, and third elevations 70, 72, and 74 define a matrix of elevational planes within assembly 54 (FIGS. 6–9). Adjacent elevations are joined by sidewalls 68 (FIGS. 6–9) which extend therebetween.

In the illustrated example, at least some of the lowermost elevations L are disposed proximate four intermediate elevations I. At least some of the intermediate elevations I are disposed proximate two lowermost elevations L and two uppermost elevations U. At least some of the uppermost elevations U disposed proximate four intermediate elevations I. Additionally, individual trenches comprise no more than two elevations therewithin. For example, trench $T_1$ comprises only intermediate I and lowermost L elevations.

Figure 11:
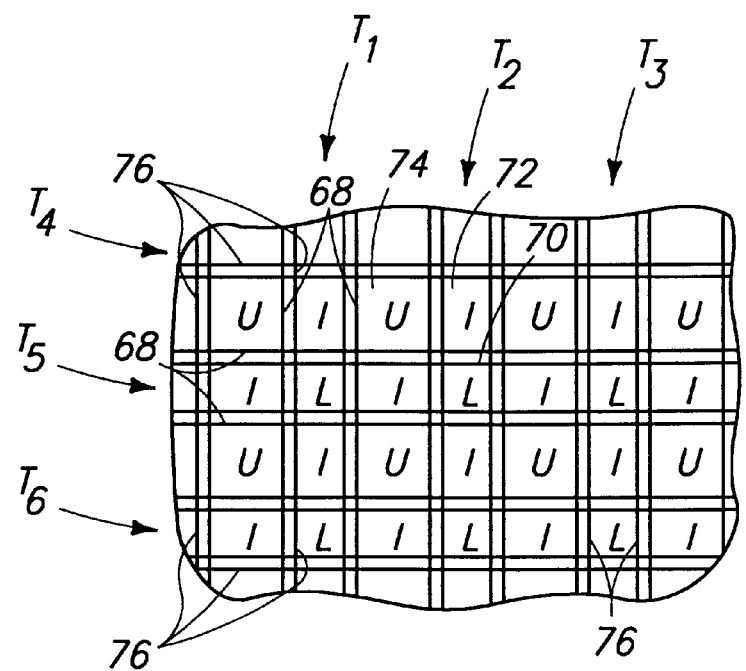
FIG. 11 is a view of the FIG. 10 wafer fragment at another processing step.
Figure 12:
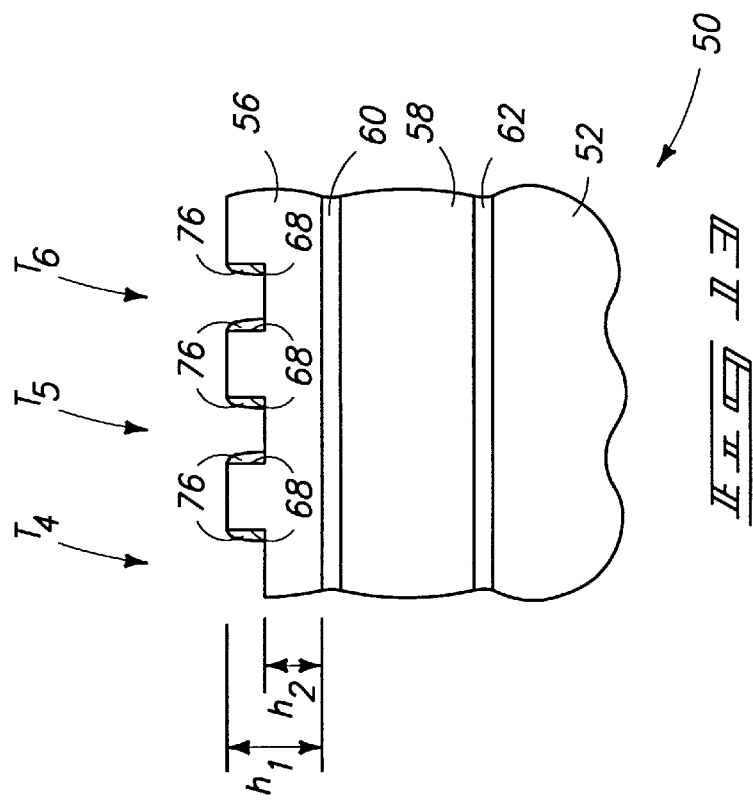
Figure 11:
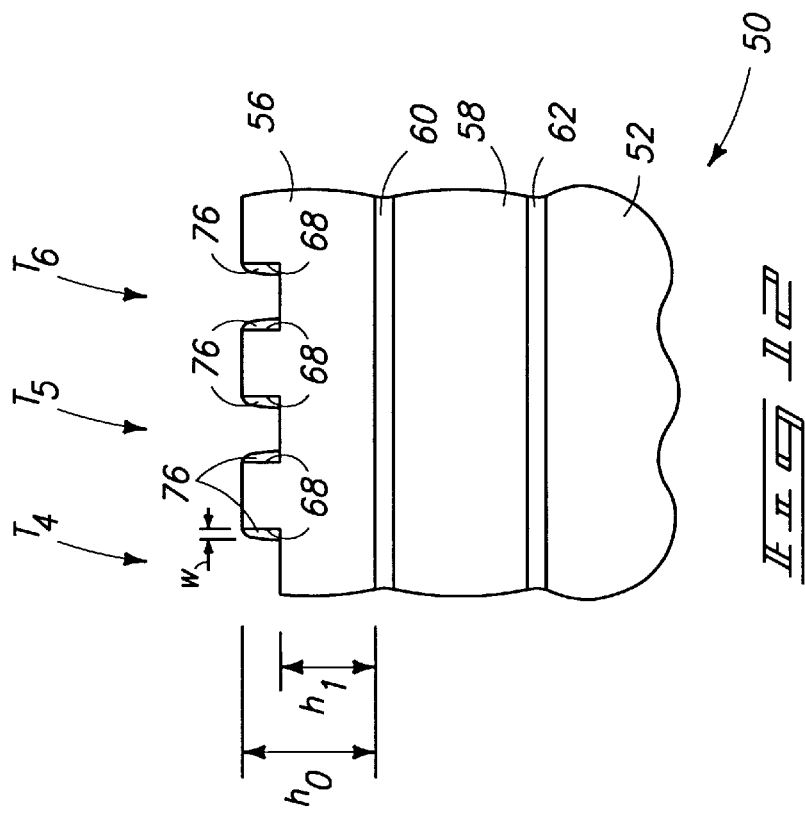

Referring to FIGS. 11–13, sidewall spacers 76 are formed over sidewalls 68 which extend between adjacent elevations. Preferably, spacers 76 are formed from a material which is etchably different from first layer 56. Accordingly, where first layer 56 comprises an oxide, a suitable material for sidewall spacers 76 comprises polysilicon. In another aspect, the material from which spacers 76 are formed comprises a material which is etchably similar to the material from which layer 60 is formed. Preferably, such materials are the same material and an exemplary material is polysilicon. As sidewalls 68 are formed at different relative elevations over the substrate, sidewall spacers 76 are formed at different elevations as well. Collectively, sidewall spacers 76 provide an array of sidewall spacers which define individual substrate structure profiles which are to be transferred into at least one of the layers underlying the spacers. Individual substrate structure profile. e.g., sidewall spacers 76, comprise respective lateral width dimensions w (FIG. 12) which are less than respective height dimensions of the spacers.

Figure 15:
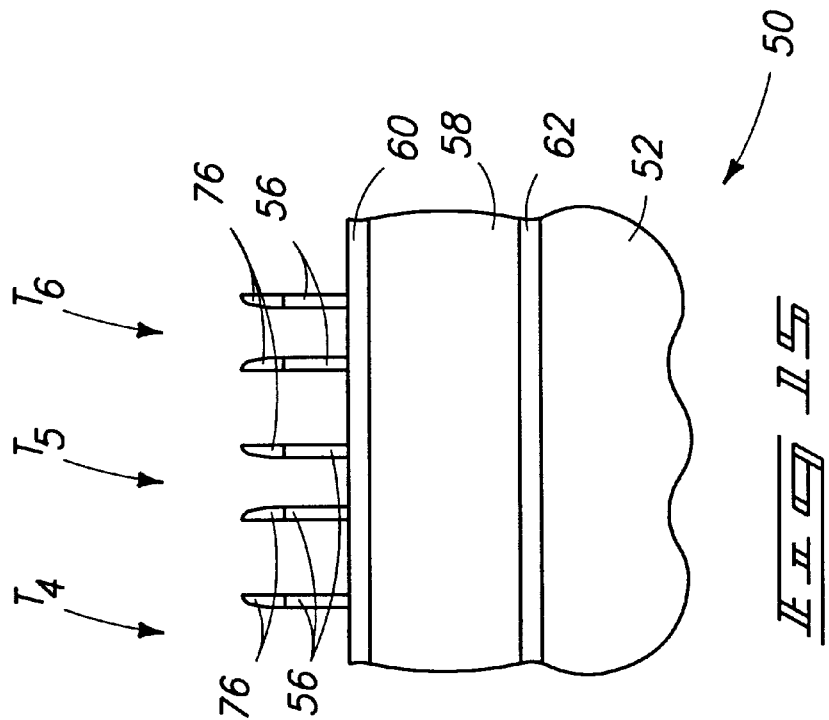
FIGS. 14 and 15 are respective views of the FIGS. 8 and 9 wafer fragment at another processing step.
Figure 14:
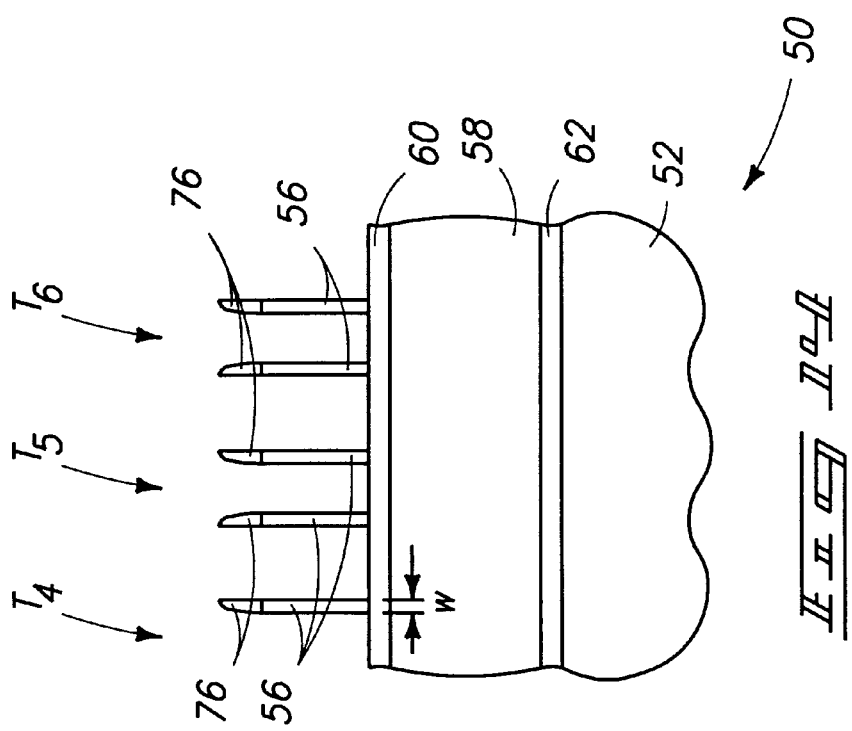

Referring to FIGS. 14 and 15, material of first layer 56 is substantially selectively etched relative to the material from which spacers 76 are formed. Such etch is preferably anisotropic and accordingly transfers lateral width dimension w of spacers 76 into layer 56. Where layer 60 comprises a material which is etchably different from layer 56, the etching of layer 56 can be controlled to slow down or terminate proximate layer 60.

Figure 16:
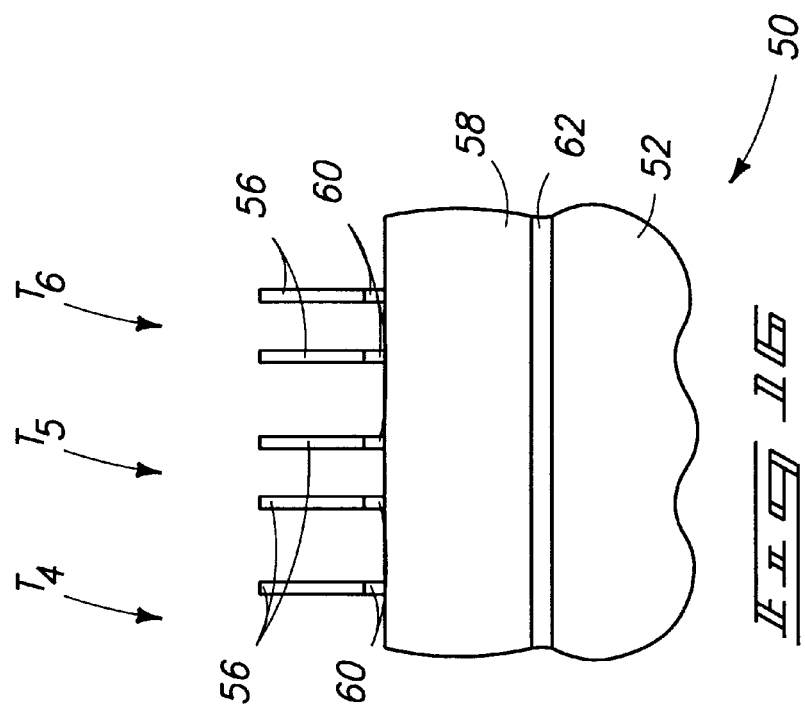
FIGS. 16 and 17 are respective views of the FIGS. 8 and 9 wafer fragment at another processing step.
Figure 17:
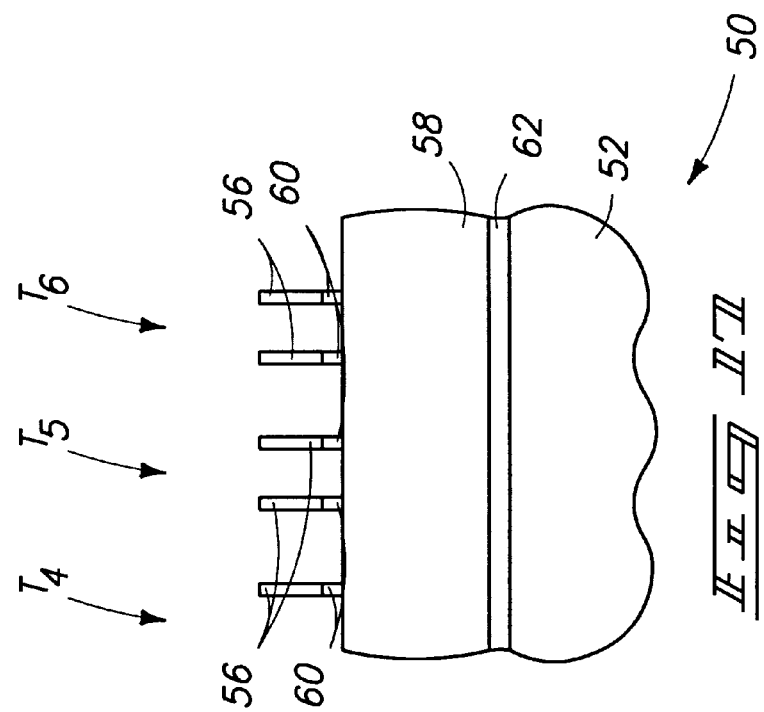

Referring to FIGS. 16 and 17, material comprising layer 60 is substantially selectively etched relative to material comprising layer 56. Where layer 60 and spacers 76 comprise etchably similar materials, such etching comprises etching the spacer material relative to the material of layer 56. Accordingly, the substrate structure profile is transferred into at least one different other underlying layer, e.g., layer 60.

Figure 19:
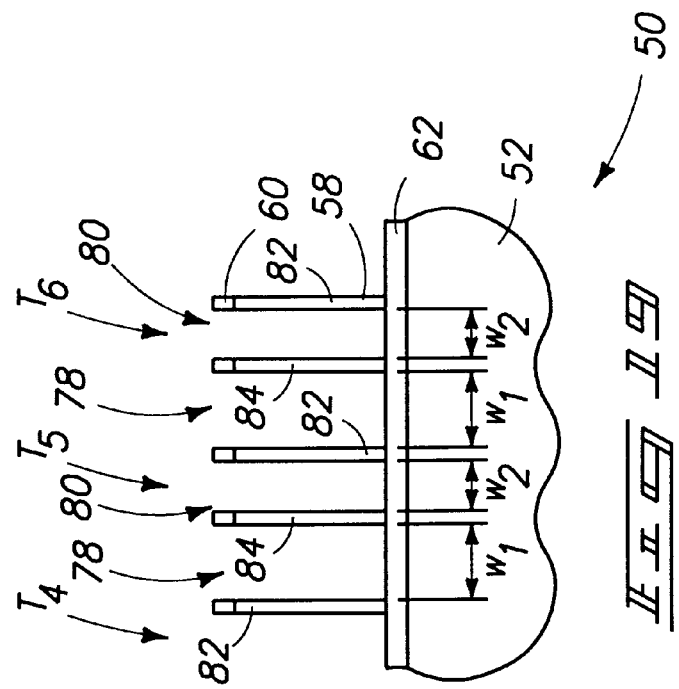
FIGS. 18 and 19 are respective views of the FIGS. 8 and 9 wafer fragment at another processing step.
Figure 18:
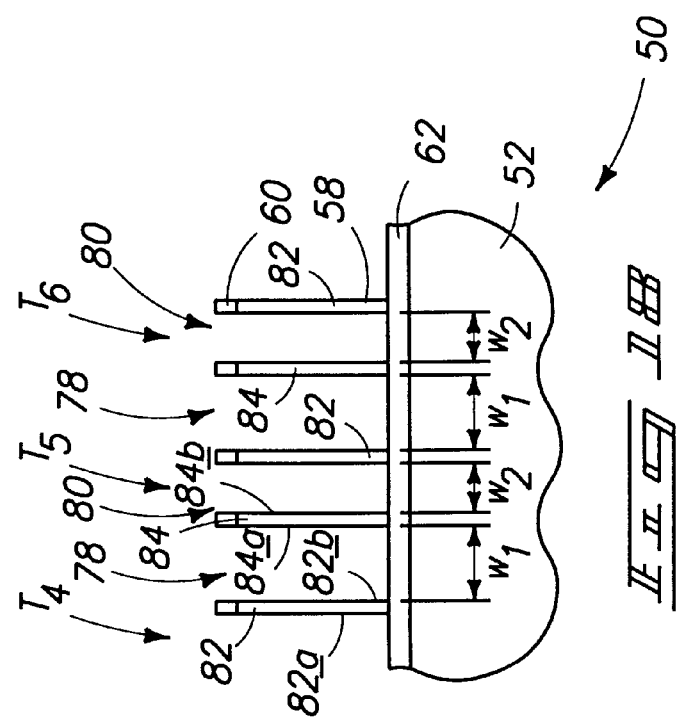
Figure 35:
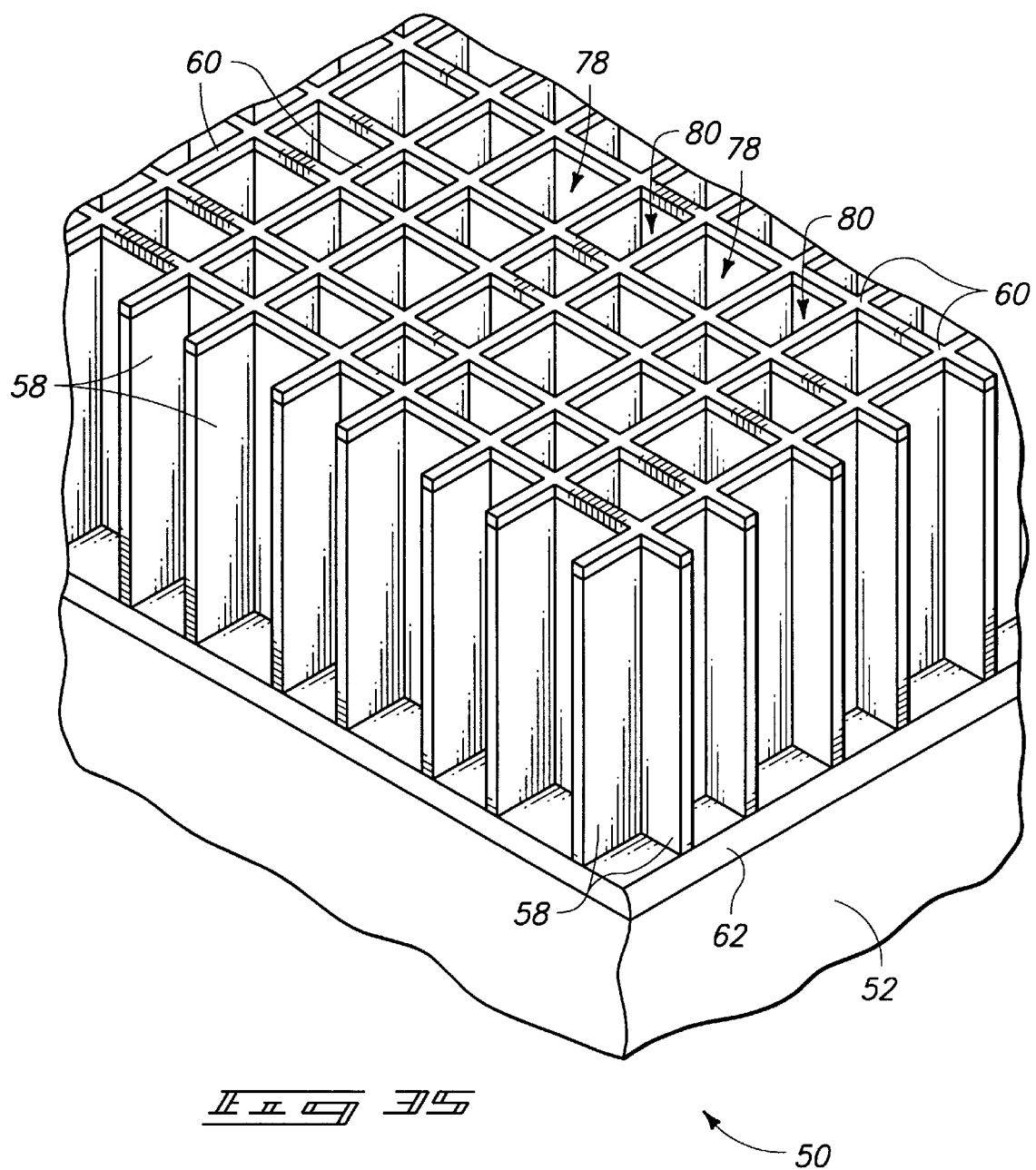
FIG. 35 is a perspective view of the FIGS. 18 and 19 wafer fragment.

Referring to FIGS. 18, 19 and 35, material comprising layer 58 is substantially selectively etched relative to material comprising layer 60. Where layers 56 and 58 comprise etchably similar materials, such etching removes formerly remnant layer 56 portions (FIGS. 16. 17) overlying material 60. In the illustrated example, and where layers 56, 58 comprise etchably similar materials, the etchings of layers 56, 58 comprises substantially selectively etching at least two of the layers relative to material from which sidewall spacers 76 (FIGS. 14, 15) are formed. Accordingly, the substrate structure profile is transferred into three of the layers comprising assembly 54, i.e., layers 56, 60, and 58.

The etching of the above-described layers can be conducted in one processing chamber, with pertinent etch chemistries being manipulated at appropriate processing points to achieve a desired degree of selectivity. The etching, forms a plurality of cells 78, 80 which are separated from one another by no more than a width dimension of an individual spacer which was previously transferred thereinto. Individual cells are defined by a plurality of walls with two such exemplary walls being indicated at 82, 84. Such walls comprise material from layers 58, 60 which is left after the last-described etch. At least some of the individual walls are shared between adjacent cells. For example, in FIG. 18, the leftmost wall 84 is shared between cells 78, 80. Each wall comprises respective wall surfaces which face generally away from one another and into a respective one of the shared cells. For example, with respect to the leftmost wall 82, such comprises wall surfaces 82a, 82b which face generally away from one another. Adjacent wall 84 comprises wall surfaces 84a and 84b. Wall surfaces 82b and 84a face one another and define therebetween a first cell width dimension $w_1$ along a line which is generally transverse to the two surfaces. Adjacent cell 80 defines a second cell width dimension $w_2$. The illustrated cell width dimensions are different from one another and generally alternate between first and second width dimensions. More desirably, however, the originally formed photoresist patterns which define the trenches within which the sidewall spacers are formed can be spaced such that the resultant widths $w_1$, $w_2$ are substantially equivalent. For example, defining a space between individual lines of photoresist which is equal to the width of a photoresist line plus twice the width of a spacer (assuming the spacers are generally of equal width), would result in a plurality of cells which are generally equivalent in dimension. Additionally, it will be noted that the respective cells are individually generally uniform in height.

Referring to FIGS. 20–33 a wafer fragment in process in accordance with another implementation of the invention is set forth generally at 50a. Like numbers from the above-described embodiment are utilized where appropriate, with differences being indicated with the suffix "a" or with different numerals.

Figure 20:
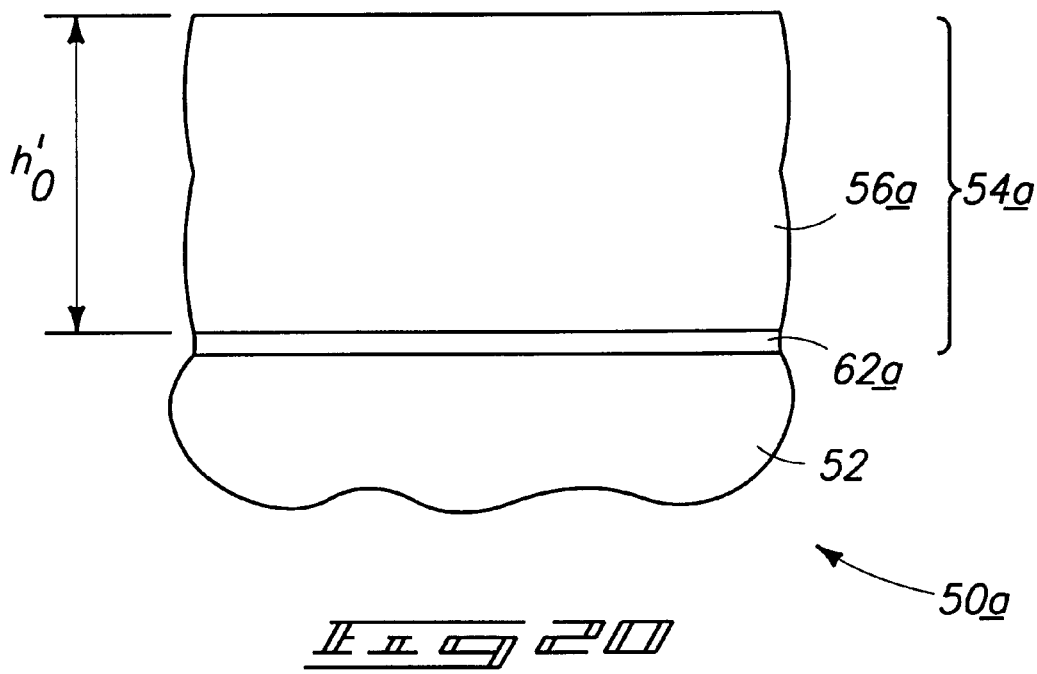
FIG. 20 is a diagrammatic view of a semiconductor wafer fragment in process in accordance with another aspect of the invention.

Referring to FIG. 20. an assembly 54a comprises a first layer 56a and a layer 62a elevationally below layer 56a. Layer 62a is an optional etch stop layer. Accordingly and in the illustrated example, layers 56a and 62a comprise etchably different materials. An exemplary material for layer 56a is an oxide such as one formed through decomposition of tetraethylorinthosilicate (TEOS), borophosphosilicate glass (BPSG), phosphosilicate glass (PSG), and the like. An exemplary material for layer 62a is nitride.

Figure 21:
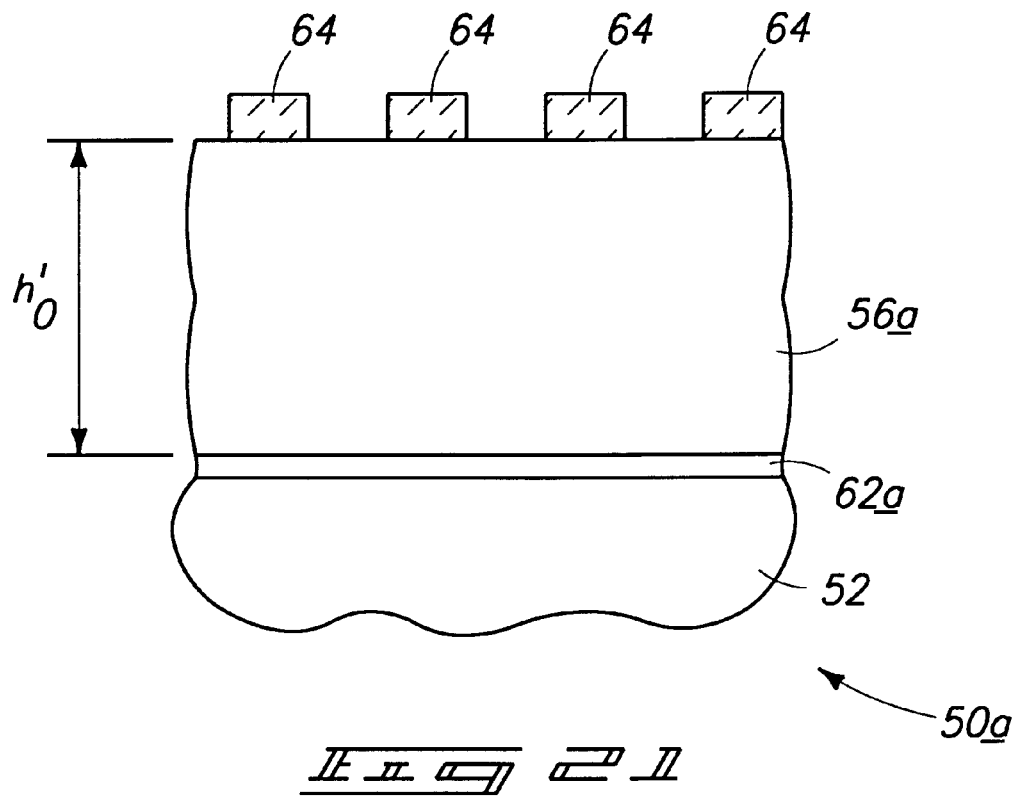
FIG. 21 is a view of the FIG. 20 wafer fragment at another processing step.
Figure 22:
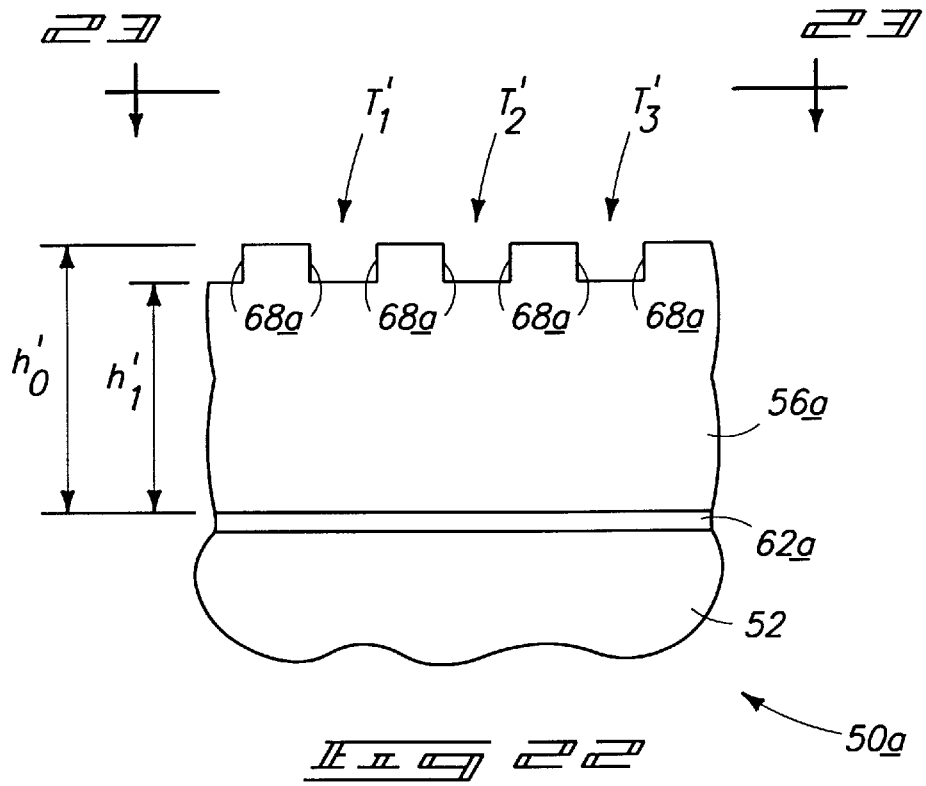
FIG. 22 is a view of the FIG. 20 wafer fragment at another processing step.
Figure 23:
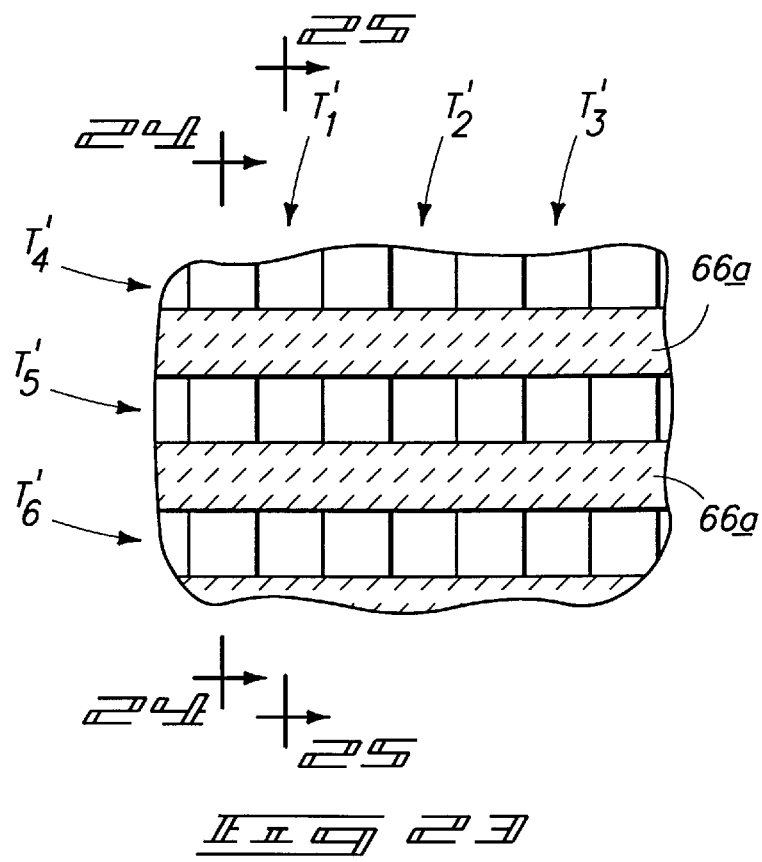
FIG. 23 is a view taken along line 23—23 in FIG. 22 at another processing step.
Figure 25:
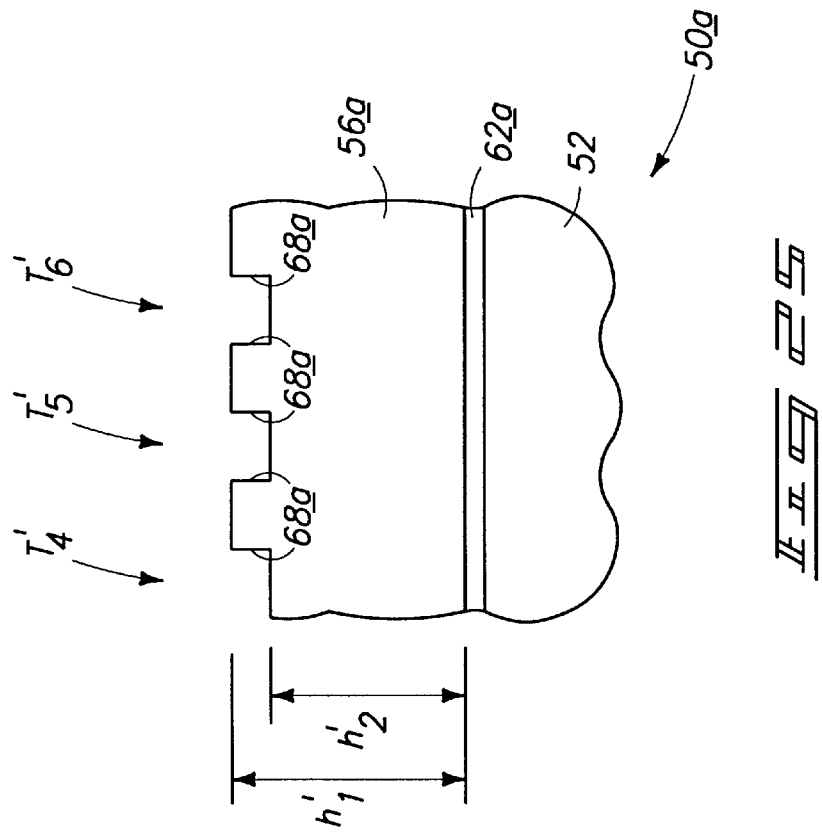
FIGS. 24 and 25 are views respectively taken along lines 24—24 and 25—25 in FIG. 23.
Figure 24:
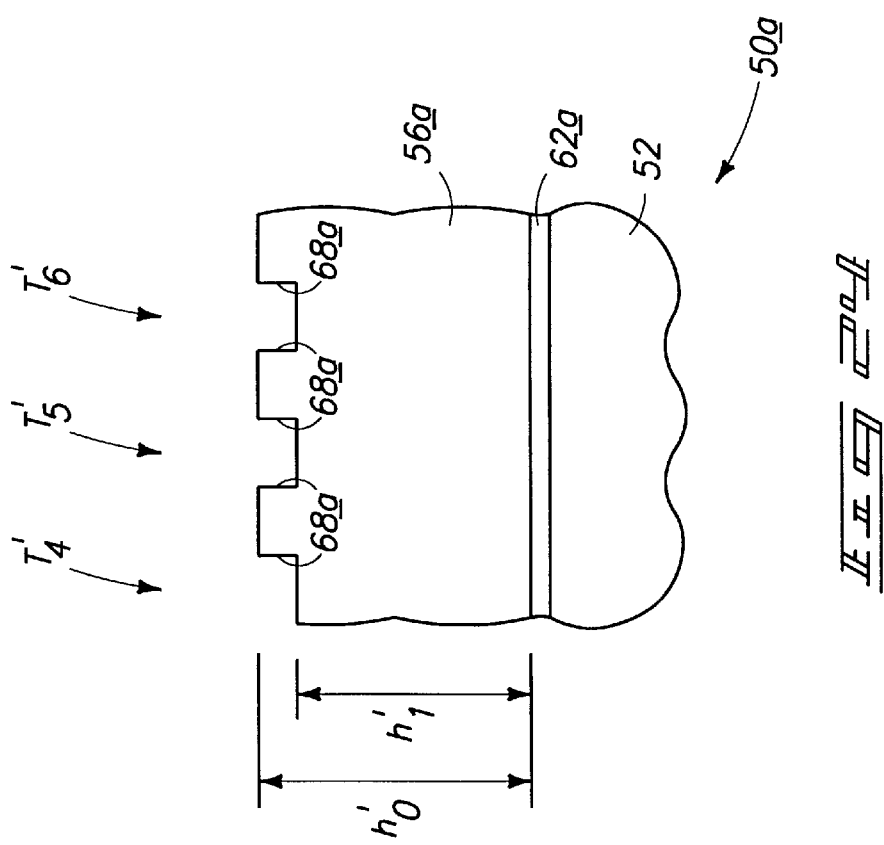

Referring to FIG. 21, a layer of patterned photoresist 64 is formed over substrate 52.

Referring to FIGS. 22–25, a first series of first trenches $T_1'$, $T_2'$, and $T_3'$ are etched or otherwise formed in layer 56a. Subsequently, photoresist 64 is removed and another layer of patterned photoresist 66a (FIG. 23) is formed to define an area within which a second series of second trenches are to be etched. Such trenches are subsequently etched and are illustrated at $T_4'$, $T_5'$, and $T_6'$.

Figure 27:
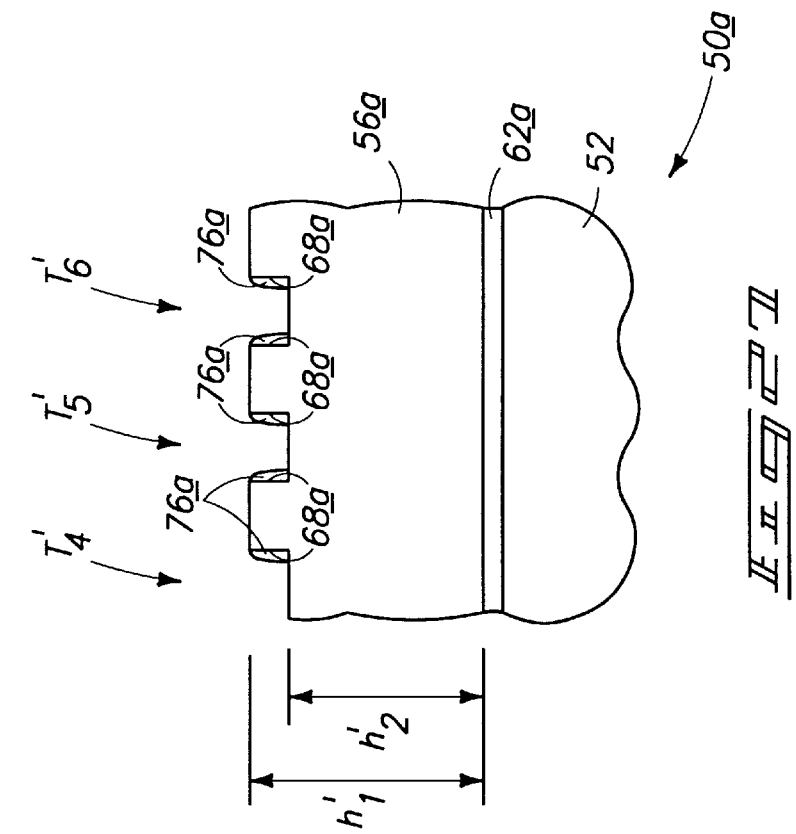
FIGS. 26 and 27 are respective views of the FIGS. 24 and 25 wafer fragment at another processing step.
Figure 26:
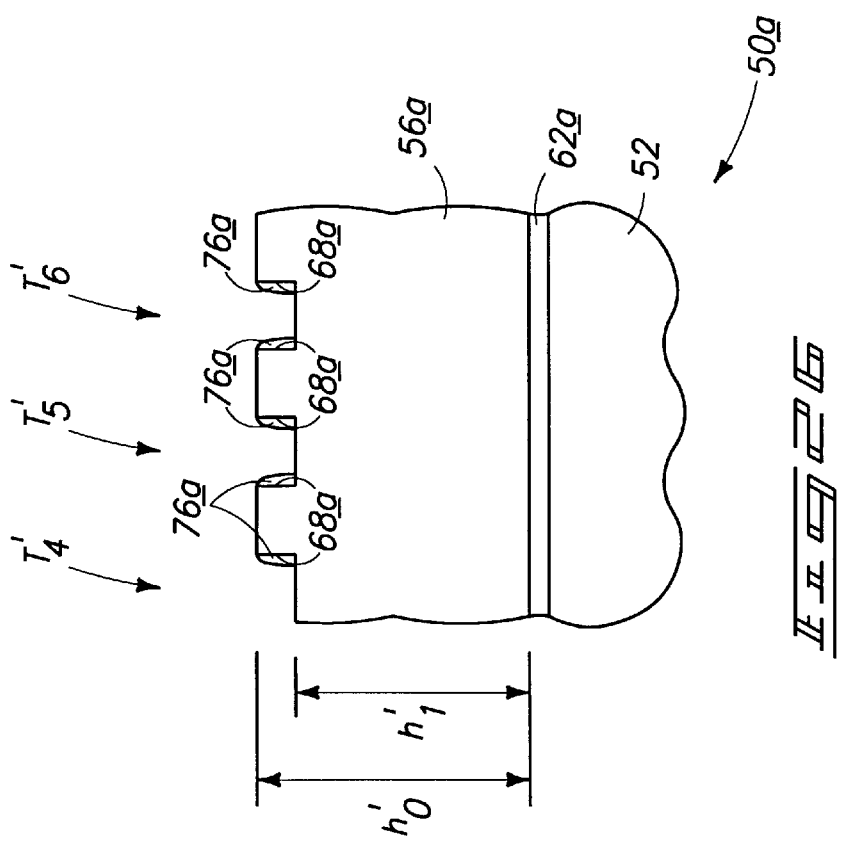

Referring to FIGS. 26 and 27, sidewall spacers 76a are formed over respective sidewalls 68a. The material from which sidewall spacers 76a are formed preferably comprises an etchably different material from the material comprising layer 56a. Accordingly, where layer 56a comprises TEOS or BPSG, the material comprising sidewall spacers 76a can comprise polysilicon or silicon nitride. Other materials include various nitrides and oxynitrides. In one aspect, the material from which sidewall spacers 76a are formed and the material from which layer 69a is formed comprise etchably similar materials. Accordingly, where layer 62a comprises a silicon nitride material, so too does sidewall spacers 76a.

Figure 29:
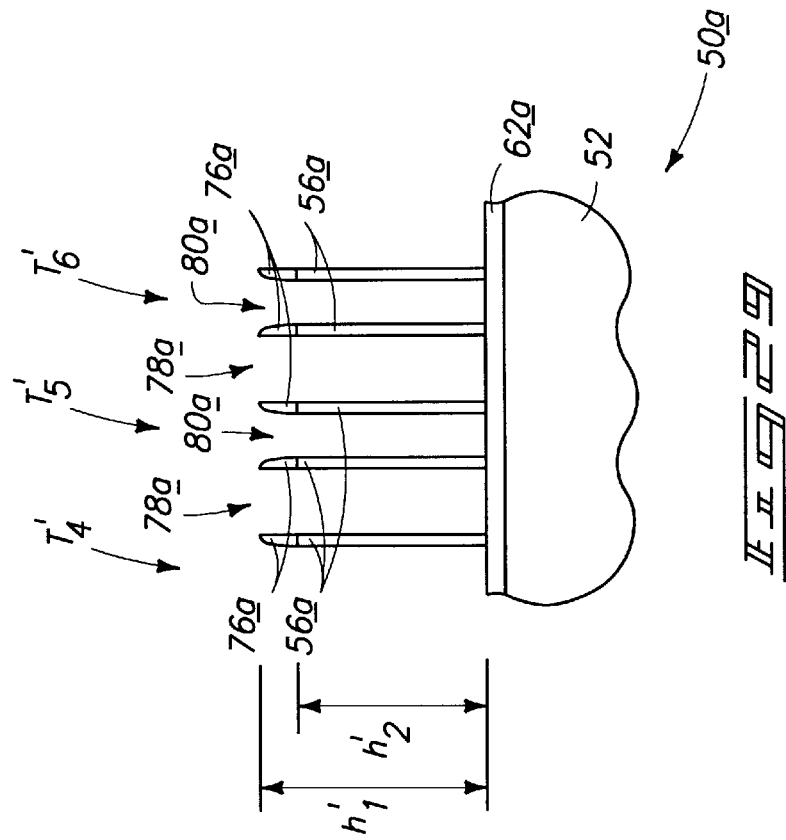
FIGS. 28 and 29 are respective views of the FIGS. 24 and 25 wafer fragment at another processing step.
Figure 28:
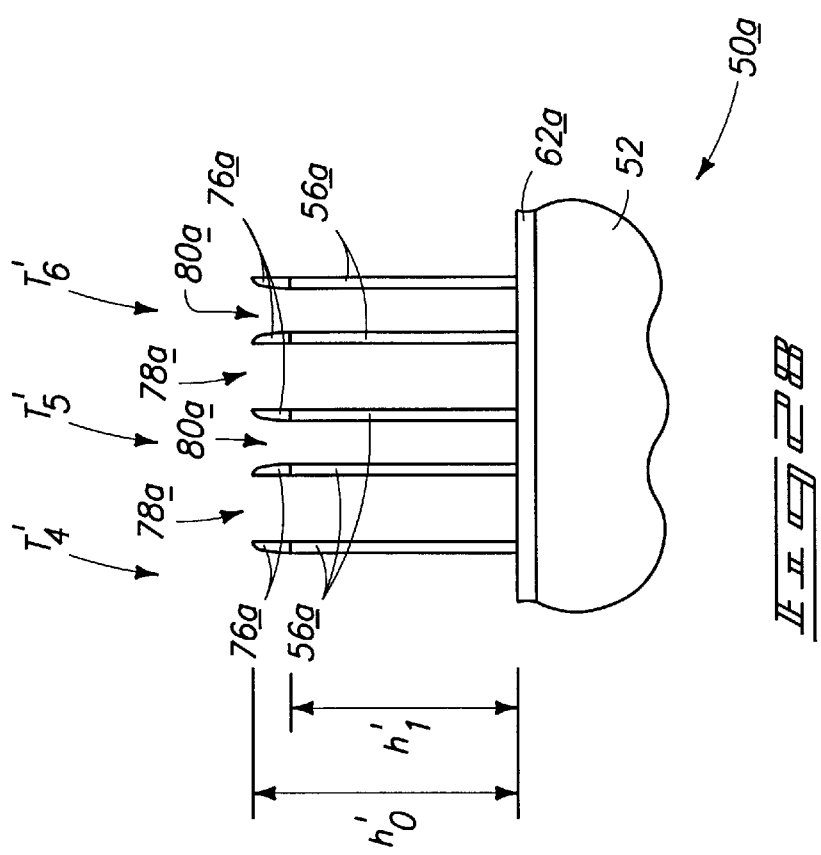
Figure 17:
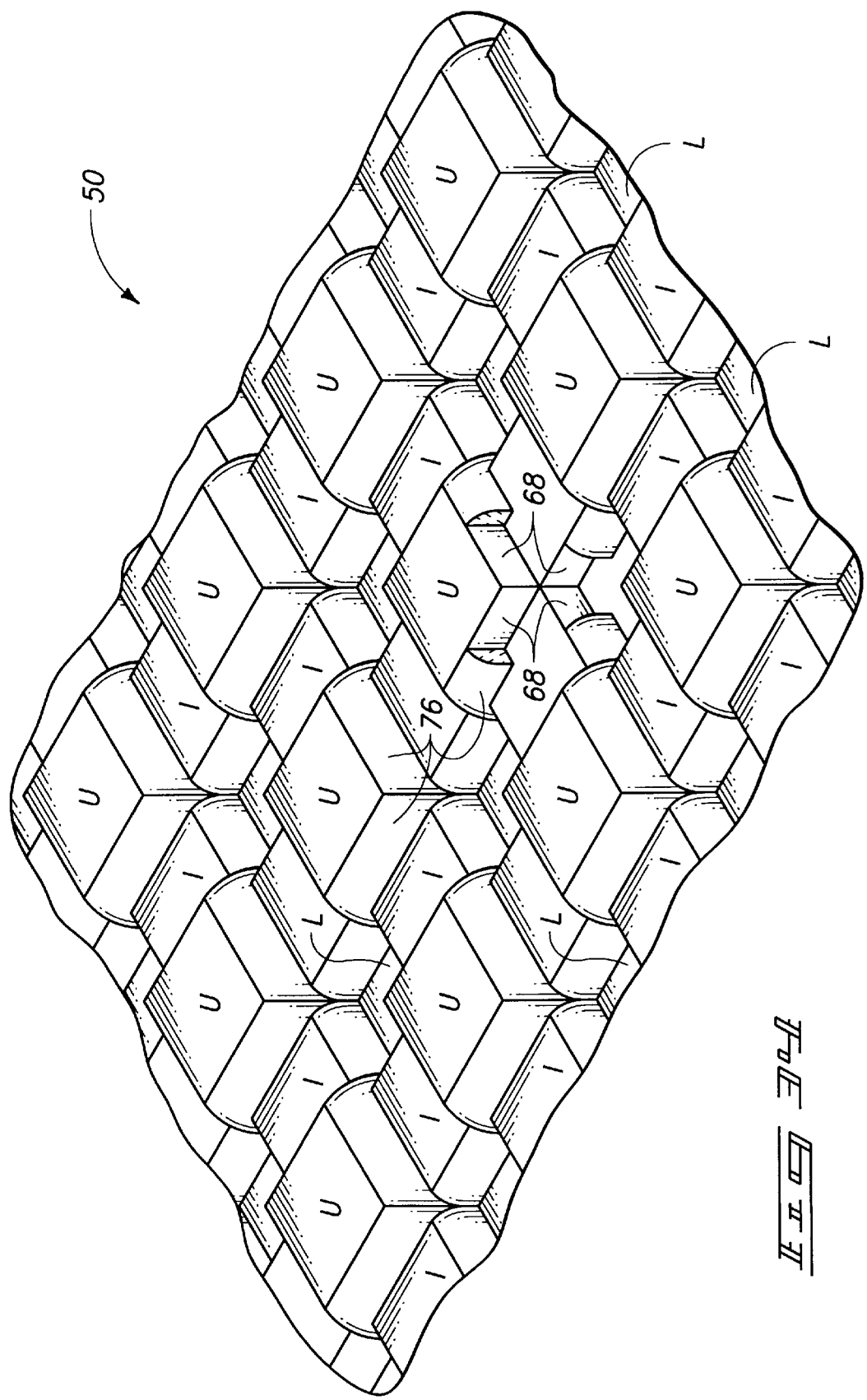

Referring to FIGS. 28 and 29, material of first layer 56a is substantially selectively etched relative to sidewall spacers 76a and layer 62a. Preferably, layer 62a is outwardly exposed by the etch. Such etching constitutes transferring the lateral width dimensions of the spacers into an underlying layer of material to define a plurality of cells 78a, 80a. The illustrated cells are separated from one another by no more than a lateral width dimension of an associated previously-formed sidewall spacer.

Referring to FIGS. 30 and 31, a layer of photoresist 77 is formed over the substrate and within the individual cells. The photoresist can be spun on sufficiently to fill the individual cells. With the photoresist in place, the substrate is subjected to suitable planarizing processing sufficient to remove some and preferably all of the material comprising the sidewall spacers. The photoresist prevents debris from falling into the cells during the planarizing of the substrate. Accordingly, the sidewall spacers can be mechanically abraded as by chemical mechanical polishing to substantially remove them from over the substrate. The resultant cell structures, with the photoresist having been removed, are shown in FIGS. 32, 33 where each cell is essentially the same height.

The above-described methodologies and resultant structures are particularly useful in the context of forming dynamic random access memory (DRAM) devices. Specifically, the above described cells can be utilized as capacitor containers which permit capacitors to be formed having desirable separation distances which are less than minimum photolithographic feature sizes. Specifically, DRAM circuitry typically includes row lines and bit lines which have a dielectric material deposited thereover to electrically isolate and insulate the lines from other components. The above-described assembly of layers (the plural layers and/or the single layer embodiments) can be formed over the row lines and bit lines, with the insulative dielectric material over the row lines and bit lines serving as an etch stop for the above-described cell formation. Processing would take place substantially as described above as far as trench formation and cell etching is concerned. The material selected for the spacers can be chosen to have similar etch characteristics as the insulative dielectric material over the row lines and bit lines. Then, etching of the cells could be tailored to slow or terminate proximate the insulative dielectric material. Alternately, a material such as polysilicon can be selected for the spacers. This would, after cell formation, permit the spacers to be subsequently removed during DRAM storage node isolation. Specifically, storage node isolation typically includes mechanical planarization of a previously-formed polysilicon-comprising storage node layer which is deposited into the individual cells. By virtue of the fact that the spacers and the node material are polysilicon, both can be subjected to planarization which removes the spacers and desirably isolates the storage node layer within individual cells. Other uses will be apparent to the skilled artisan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. Integrated circuitry comprising:

a substrate;

a plurality of cells disposed over the substrate, individual cells being defined by a plurality of walls, at least some individual walls of the plurality of walls being shared between adjacent cells and comprising respective wall surfaces which face generally away from one another and into a respective one of the shared cells;

at least two separate wall surfaces of a respective cell facing one another and defining a width dimension along a line generally transverse the two surfaces; and the width dimension of adjacent cells along the line alternating between first and second width dimensions which are different from one another, wherein there are at least four adjacent cells disposed along the line.

2. Integrated circuitry comprising:

a substrate;

a plurality of elongate cells disposed over the substrate and extending away therefrom along individual respective long axes, individual cells having individual openings which define individual geometries and cell walls which extend between the openings and the substrate; and each cell sharing a cell wall with a plurality of neighboring cells, wherein the geometries defined by the opening of a cell and a respective neighboring cell opening are different.

3. The integrated circuitry of claim 2, wherein the long axes are generally parallel with one another.

4. The integrated circuitry of claim 2, wherein a majority of the cells share more than two individual cell walls with more than two respective individual neighboring cells.

5. The integrated circuitry of claim 2, wherein a majority of the cells have four cell walls, each cell wall being shared with a different neighboring cell.

6. The integrated circuitry of claim 2, wherein the cell geometries are four-sided geometries.

* * * * *

UNITED STATES PATENT AND TRADEMARK OFFICE
CERTIFICATE OF CORRECTION

PATENT NO : 5,939,741
DATED : August 17, 1999
INVENTOR(S) : Darwin A. Clampitt et al.

It is certified that error appears in the above-identified patent and that said Letters Patent is hereby corrected as shown below:

Col. 2, line 1
 replace "another"
 with --another processing step--.

Col. 2, line 58
 replace "comprise"
 with --comprises--.

Col. 5, line 45
 replace "$T_1$•"
 with --$T_1'$--.

Col. 5, line 46
 replace "$T_2$•'"
 with --$T_2'$--.

Col. 5, line 61
 replace "69a"
 with --62a--.

Signed and Sealed this

Ninth Day of May, 2000

Attest:

Attesting Officer

Q. TODD DICKINSON

Director of Patents and Trademarks